United States Patent
Liu et al.

(10) Patent No.: US 8,440,529 B2
(45) Date of Patent: May 14, 2013

(54) METHOD OF MANUFACTURING SUPERJUNCTION STRUCTURE

(75) Inventors: Jiquan Liu, Shanghai (CN); Xuan Xie, Shanghai (CN)

(73) Assignee: Shanghai Hua Hong NEC Electronics Co., Ltd., Shanghai (CN)

( * ) Notice: Subject to any disclaimer, the term of this patent is extended or adjusted under 35 U.S.C. 154(b) by 289 days.

(21) Appl. No.: 13/075,017

(22) Filed: Mar. 29, 2011

(65) Prior Publication Data
US 2011/0244664 A1 Oct. 6, 2011

(30) Foreign Application Priority Data
Mar. 31, 2010 (CN) .......................... 2010 1 0137500

(51) Int. Cl.
*H01L 21/00* (2006.01)
(52) U.S. Cl.
USPC ........................................ 438/268; 438/270
(58) Field of Classification Search ........... 438/268–272
See application file for complete search history.

(56) References Cited

U.S. PATENT DOCUMENTS

| | | | | |
|---|---|---|---|---|
| 7,279,368 B2* | 10/2007 | Harris et al. | ................... | 438/137 |
| 7,355,223 B2* | 4/2008 | Harris et al. | ................... | 257/256 |
| 2004/0129973 A1 | 7/2004 | Saito et al. | | |

FOREIGN PATENT DOCUMENTS

| | | |
|---|---|---|
| CN | 1823423 A | 8/2006 |
| CN | 1866538 A | 11/2006 |
| JP | 2001-196573 A | 7/2001 |

* cited by examiner

*Primary Examiner* — Richard Booth
(74) *Attorney, Agent, or Firm* — Blakely, Sokoloff, Taylor & Zafman

(57) ABSTRACT

The present invention discloses a method of manufacturing superjunction structure, which comprises: step 1, grow an N type epitaxial layer on a substrate having a (100) or (110) oriented surface; step 2, etch the N type epitaxial layer to form trenches therein; step 3, fill the trenches by P type epitaxial growth in the trenches by using a mixture of silicon source gas, halide gas, hydrogen gas, and doping gas. By using the manufacturing method according to the present invention, no void or only small voids are formed in the trenches after trench filling.

22 Claims, 6 Drawing Sheets

(a)                    (b)

METHOD OF MANUFACTURING SUPERJUNCTION STRUCTURE

BACKGROUND OF THE INVENTION

1. Field of the Invention

The present invention relates to a method of IC manufacturing, and in particular, to a method of manufacturing a superjunction structure.

2. Description of Related Art

It is known that a superjunction structure as shown in FIG. 1 is often used as a power MOSFET having both high withstand voltage and low on resistance. In FIG. 1, an N type region 2 is formed on a semiconductor substrate 1. P type regions 3 are filled in the N type region 2 to form alternating P type and N type regions. A body contact region 5, a source region 6, and a P+ implantation region 7 are arranged at both sides of each P type region 3 from outside in. Gate insulating films and gate electrodes 4 are formed on the N type region 2. Insulating films 8 are deposited on the gate electrodes 4. A source metal electrode 9 is formed to cover the insulating films 8 and the P type regions 3. A drain electrode 10 is formed on the backside of the semiconductor substrate 1.

It is not easy to manufacture the aforementioned superjunction structure, especially the alternately arranged P type 3 an N type 2 pillars. In the prior art, there are mainly two methods of manufacturing superjunction structures.

The first method of manufacturing superjunction structure is shown in FIG. 2. Firstly, grow a 1st N type epitaxial layer 22a on a substrate 21, afterwards, implant P type dopants into the 1st N type epitaxial layer to form a 1st implantation region 23a. Secondly, grow a 2nd N type epitaxial layer 22b on the 1st N type epitaxial layer, and then, implant P type dopants into the 2nd N type epitaxial layer 22b to form a 2nd implantation region 23b. Repeat the steps of epitaxial growth and implantation until the thickness of the N type epitaxial layer meets the requirement, wherein, the implantation regions are vertically aligned with one another. Finally, diffuse the P type dopants to form a P type pillar 25 by anneal. In this way, a complete P (or N) type pillar is finished.

The problems of the first method include: high cost, since epitaxial growth and implantation are both processes of high cost in semiconductor manufacturing; difficulty in process control, as the several times of epitaxial growth require the same resistivity and film quality; requirement of high alignment accuracy, since the dopants are required to be implanted at the same position.

Another method of manufacturing superjunction structure is shown in FIG. 3. Firstly, grow a thick N type epitaxial layer 32 on the substrate 31. Secondly, etch the N type epitaxial layer 32 to form trenches 35. Thirdly, fill P type epitaxial material 33 in the trenches 35 by P type epitaxial filling process. Finally, planarize the top of the trenches 35 by CMP process. The cost of this manufacturing method is lower than the first method, but voids and defects are easily formed in the trenches during the step of epitaxial filling due to the difference between the growth speed at the top of the trenches and the growth speed at the bottom of the trenches. Such voids and defects will have great impact on the performance of the device.

SUMMARY OF THE INVENTION

The technical problem to be solved by the present invention is to provide a method of manufacturing superjunction structure which can realize deep trench tilling without void or with only small voids.

To solve the aforesaid technical problem, the present invention provides a method of manufacturing superjunction structure which comprises the following steps:

step 1: grow an N type epitaxial layer on a substrate having a (100) or (110) oriented surface;

step 2: etch the N type epitaxial layer to form trenches therein;

step 3: fill the trenches by means of P type epitaxial growth in the trenches by using a mixture of silicon source gas, halide gas, hydrogen gas, and doping gas.

step 4: planarize the top of the trenches by CMP.

Alternatively, the N type epitaxial layer in steps 1 and 2 could be replaced by a P type epitaxial layer, and the P type epitaxial growth in step 3 could be correspondingly replaced by an N type epitaxial growth in the above technical solution.

The thickness of the N type epitaxial layer or the P type epitaxial layer as described in step 1 is from 1.0 μm to 100.0 μm.

The trench as described in step 2 has a width (or critical dimension) of 0.2-10.0 μm, and a depth of 0.8-98.0 μm. Furthermore, the depth of the trench should be smaller than the thickness of the epitaxial layer as formed in step 1.

The top view of the deep trench as formed in step 2 has a profile of square, rectangle or stripe. When the profile of the deep trench is square or rectangular, if the crystal orientation of the substrate is (100), the crystal orientation of the sidewalls of the deep trench is (100); if the crystal orientation of the substrate is (110), the crystal orientation of the sidewalls of the deep trench is (111); the bottom profile of the deep trench is a smooth curved surface with complicated crystal orientations. When the profile of the deep trench is a stripe, if the crystal orientation of the substrate is (100), the crystal orientation of the longer sidewall of the deep trench is (100), the shorter sidewall can be a (100) crystal plane or a plane having multiple crystal orientations or a smooth curved surface; if the crystal orientation of the substrate is (110), the crystal orientation of the longer sidewall of the deep trench is (111), the shorter sidewall can be a (111) crystal plane or a plane having multiple crystal orientations or a smooth curved surface; the bottom profile of the deep trench is a smooth curved surface with complicated crystal orientations.

The temperature of the P type or N type epitaxial growth in step 3 is 800-1000. The pressure of the P type or N type epitaxial growth is 0.01-760 torr.

The silicon source gas is at least one of $SiH_3Cl$, $SiH_2Cl_2$, $SiHCl_3$ and $SiCl_4$.

The halide gas is at least one of HCl and HF.

The doping gas is at least one of boron hydride (e.g. $B_2H_6$), phosphine (e.g. $PH_3$) and arsenic hydride (e.g. $AsH_3$).

The P type or N type epitaxial growth in step 3 can be achieved by one or more steps of epitaxial growth. If more than one step of epitaxial growth is adopted, a reaction gas composed of halide gas only, or composed of halide gas and hydrogen gas, or composed of halide gas, hydrogen gas and doping gas can be used to enlarge the opening of the deep trenches before the top of the deep trenches are closed.

By using the method according to the present invention, no void or only small voids are formed in the deep trenches after the epitaxial filling process.

Generally, during the process of epitaxial filling, the concentration of the reaction gas decreases from the top down in the deep trenches. If the reaction gas is composed of only silicon source gas, hydrogen gas and doping gas, the epitaxial growth rate at the top of the deep trenches will be higher than the epitaxial growth rate at the bottom, as a result, the top of the trenches will be closed before the trenches are completely filled, thereby leaving a strip of void in each trench, as shown in FIG. 4(a).

In the present invention, silicon etching gas, namely the halide gas is added into the reaction gas to adjust the epitaxial growth rates in the deep trenches. Since halide gas has a character of silicon etching, when halide gas is adopted during the process of silicon epitaxial filling, the concentration of the halide gas also decreases from the top down in the trenches, while the effect of the halide gas is opposite to the effect of the silicon source gas, so that the difference between the epitaxial growth rates in the deep trenches can be counterbalanced. By introducing halide gas into the reaction gas, the growth rate at the top of the trenches is almost the same as the growth rate at the bottom of the trenches, therefore, no void or only small voids are left inside the trenches after the trenches are completely filled.

However, even if a mixture of silicon source gas and halide gas is used for epitaxial growth, it is still possible that the openings of the deep trenches be closed before the trenches are completely tilled, as the epitaxial growth rate is higher than the etch rate. Therefore, a reaction gas composed of halide gas only, or composed of halide gas and hydrogen gas, or composed of halide gas, hydrogen gas and doping gas can be used before the openings at the top of the deep trenches are closed, in this way, the openings of the deep trenches can be enlarged so that the trenches can be further filled.

Since crystal orientation has an impact on epitaxial growth, different crystal orientations of the silicon substrate and different profiles and arrangements of the trench will lead to different trench filling results. Among the three commonest crystal planes (100), (110) and (111), the epitaxial growth rate on crystal plane (110) is the highest, while the epitaxial growth rate on crystal plane (111) is the lowest. Under the same temperature, pressure and flow rate of silicon source gas, crystal plane (111) has a chemical reaction type that is most likely to control the reaction rate, while crystal plane (110) has a chemical reaction type that is most likely to control the reaction flow rate. Therefore, a (111) oriented trench sidewall is the most advantageous for trench filling, and the secondly advantageous is crystal plane (100). FIG. 4 is a comparison of different results of trench filling by using different crystal planes as trench sidewalls. In FIG. 4, (a) shows the trench filling result by using (110) oriented crystal planes as trench sidewalls, while (b) shows the trench tilling result by using (100) oriented crystal planes as trench sidewalls. FIG. 4 indicates that it is easier to completely fill a trench having (100) oriented sidewalls than to fill a trench having (110) oriented sidewalls on a silicon substrate with a (100) crystal orientation. Furthermore, it is easier to completely fill a trench having (111) oriented sidewalls than to fill a trench having (110) oriented sidewalls on a silicon substrate with a (110) crystal orientation.

Preferably, the sidewall of the trench should be a single plane, because a curved surface or a multi-plane surface will have complicated crystal orientations, which will lead to different growth rates in the trench, and voids are likely to form. The bottom surface of the trench should be a smooth curved surface, preferably concave-down. Compared with a flat bottom surface, on which defects are likely to form at orthogonal corners, such smooth curved surface can prevent the formation of defects during the process of epitaxial growth, and also prevent electronic charges to accumulate at the orthogonal corners of the bottom surface, so that the breakdown voltage is increased.

BRIEF DESCRIPTION OF THE DRAWINGS

The foregoing advantages and features of the invention will become apparent upon reference to the following detailed description and accompanying drawings, of which.

DETAILED DESCRIPTION OF THE INVENTION

Embodiment 1

Figure 1:
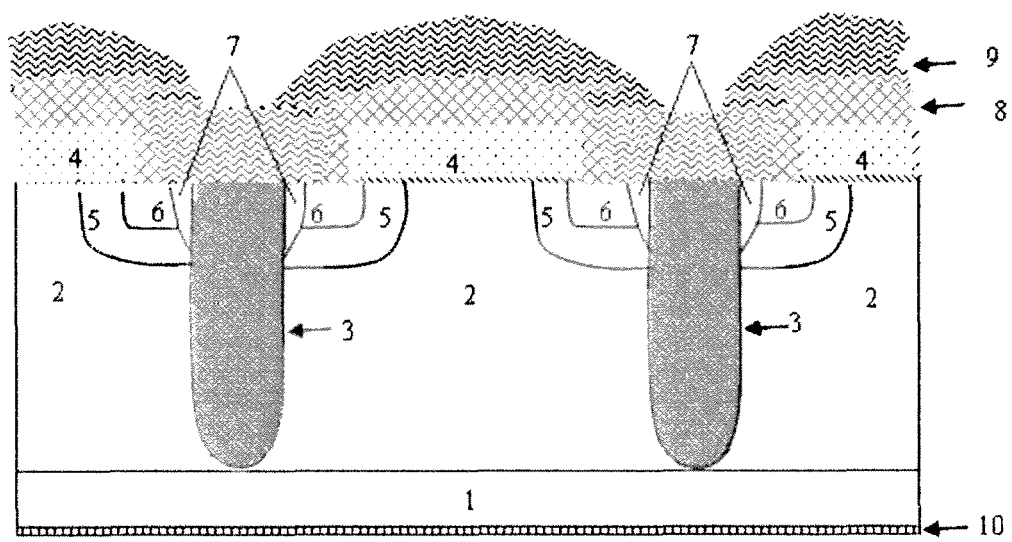
FIG. 1 is a sectional view of a superjunction device.
Figure 2:
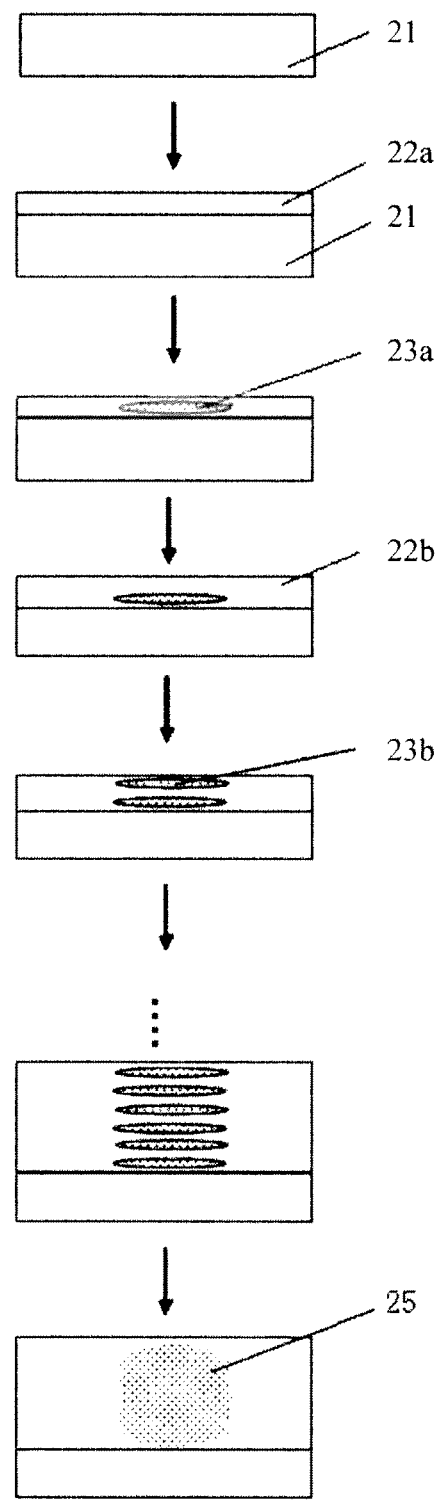
FIG. 2 is a schematic view of a method of manufacturing superjunction structure in the prior art.
Figure 3:
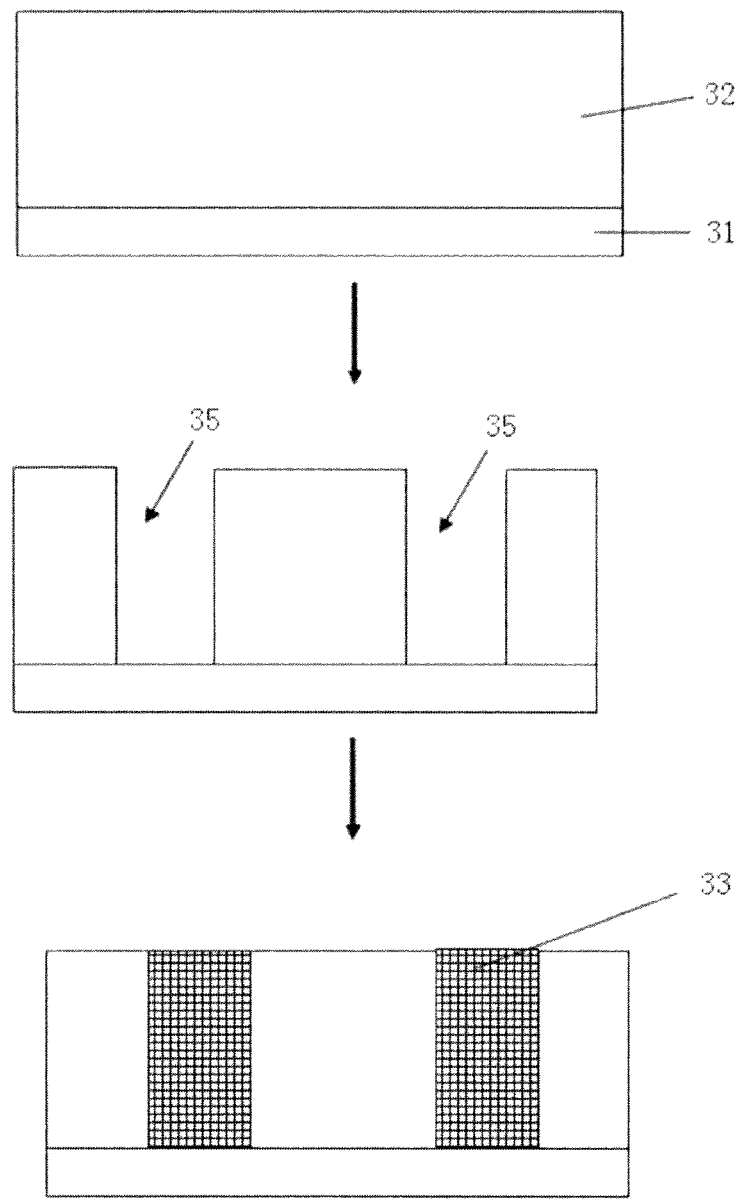
FIG. 3 is a schematic view of another method of manufacturing superjunction structure in the prior art.
Figure 4:
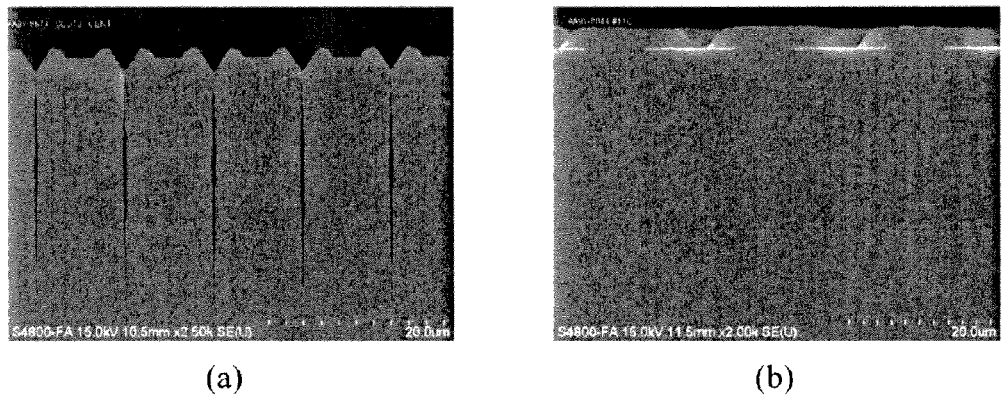
FIG. 4 is a comparison of different results of trench filling by using different crystal planes as trench sidewalls.
Figure 5:
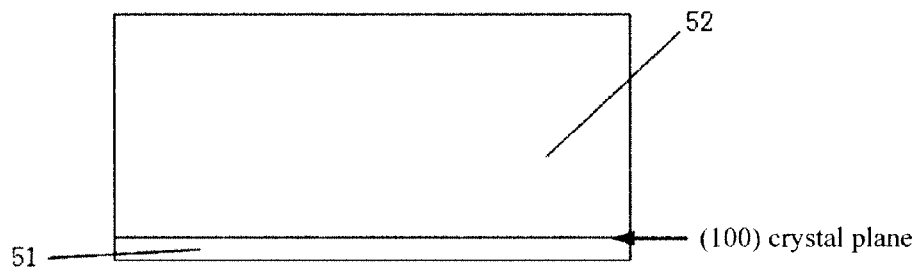
FIGS. 5-8 are schematic views of the manufacturing method according to one embodiment of the present invention.
Figure 9:
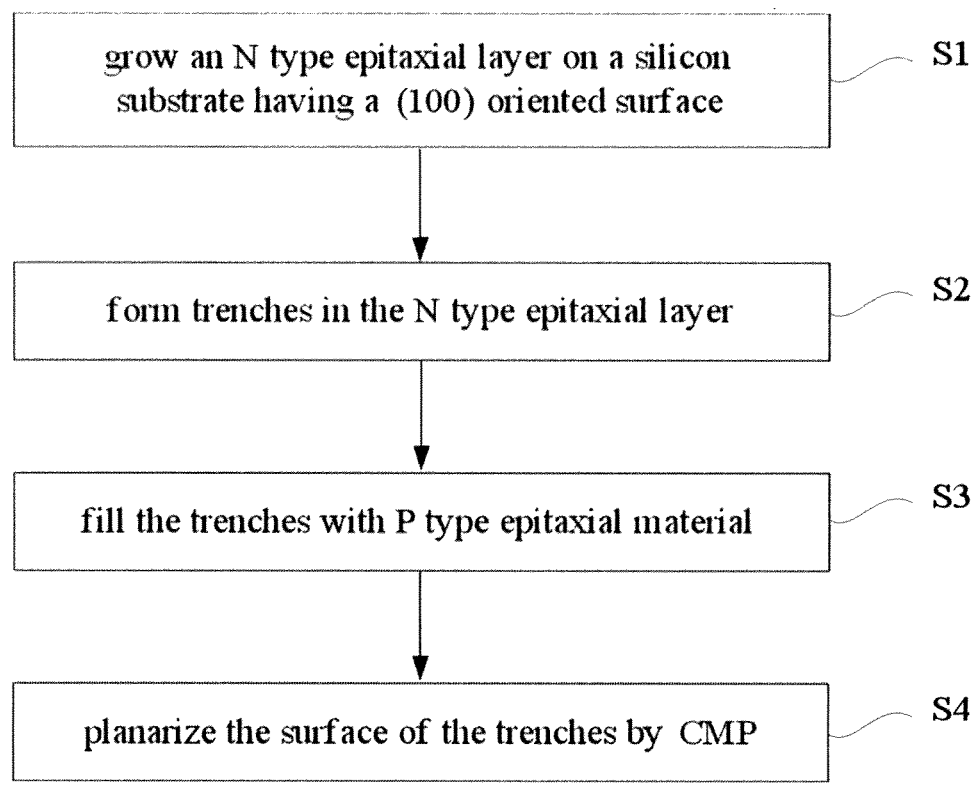
FIG. 9 is a flow chart of the manufacturing method according to one embodiment of the present invention.

Refer to FIG. 9, the method of manufacturing superjunction structure according to the present invention comprises the following steps:

As shown in FIG. 5, in step S1, grow an N type epitaxial layer 52 on a silicon substrate 51 having a (100) oriented surface, wherein the substrate 51 is a heavily doped N type silicon substrate, the surface of which is a (100) crystal plane; the epitaxial layer 52 is a lightly doped N type epitaxial layer, the thickness of which is in the range of 40.0 µm to 50.0 µm.

Figure 6:
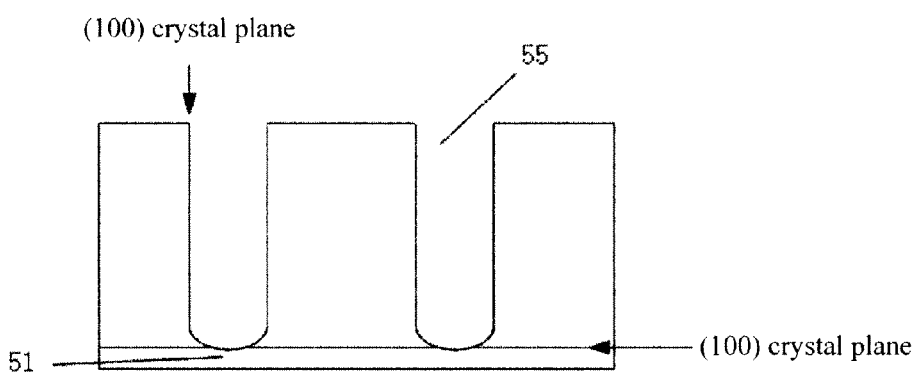

Next, in step S2, form trenches 55 in the N type epitaxial layer 52 (see FIG. 6). In detail, firstly grow one or more silicon oxide layers on the N type epitaxial layer 52 and pattern the silicon oxide layers (not shown in the figure); then etch the N type epitaxial layer 52 by using the patterned silicon oxide layers as hard mask to form the trenches 55, wherein the trenches 55 have a depth of 35.0 µm to 50.0 µm, and the top view of the deep trenches has a profile of square, rectangle or stripe. When the top profile of the deep trenches 55 is square or rectangular, all the sidewalls of the deep trenches 55 have a crystal orientation of (100); when the top profile of the deep trenches is a stripe, the longer sidewalls of the deep trenches 55 have a crystal orientation of (100), while the shorter sidewalls of the deep trenches 55 can be a single crystal plane or a plane having multiple crystal orientations or a smooth curved surface. The bottom profile of the deep trenches 55 is a smooth curved surface with complicated crystal orientations. The silicon oxide layers can be removed or remained after trench etching. If silicon oxide hard mask is remained, selective epitaxial growth is performed subsequently by adjusting the ratio between the flow rate of silicon source gas and the flow rate of halide gas to prevent the growth of silicon on the silicon oxide layers.

Figure 7:
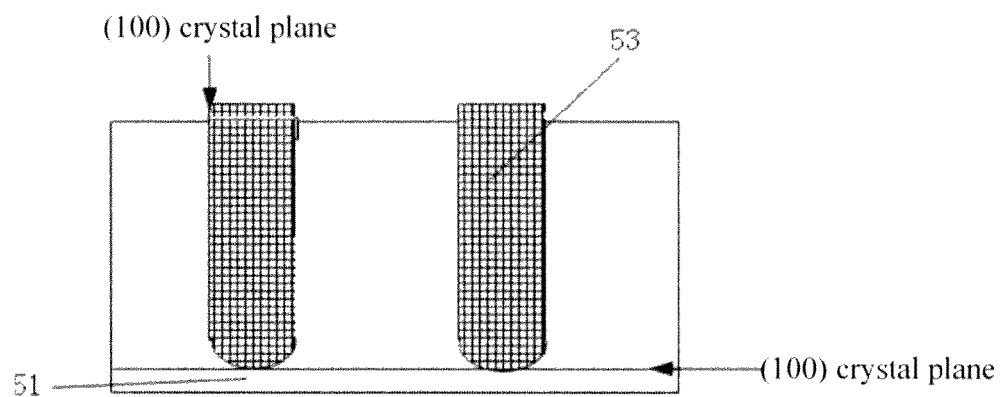

Refer to FIG. 7, afterwards, in step S3, till the trenches 55 with P type epitaxial material 53 by means of P type epitaxial growth. According to this embodiment, a mixture of silicon source gas, halide gas, hydrogen gas, and doping gas are used as reaction gas during the process of P type epitaxial growth. For different silicon source gases, different growth temperatures and pressures are used. Preferably, silicon source gas with higher content of chlorine should adopt higher reaction temperature and higher pressure, or defects are likely to form. The process of epitaxial filling can be achieved by one step or several steps (firstly fill the bottom part and finally fill the top). If more than one step of epitaxial filling is adopted, the opening of the trench can be enlarged by stop supplying silicon source gas. The several steps of epitaxial filling can be performed in succession, so that the wafer is transferred into and out of the machine for only once. In this embodiment, the silicon source gas is at least one of SiH3Cl, SiH2Cl2, SiHCl3 and SiCl4; the halide gas is at least one of HCl and HF; the doping gas is boron hydride (e.g. B2H6). The temperature of the P type epitaxial growth is 800-1000. The pressure of the P type epitaxial growth is 0.01-760 torr.

Figure 8:
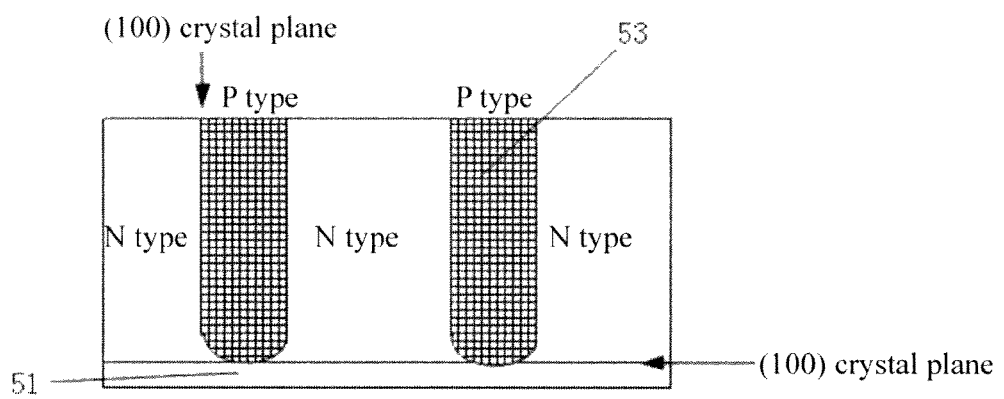

After trench tilling, the surface of the P type epitaxial material 53 will be higher than the surface of the N type epitaxial layer 52 due to over growth of the epitaxial material. Therefore, as shown in FIG. 8, finally in step S4, planarize the surface of the trenches by chemical mechanical polishing.

In this embodiment, the hard mask used for trench etching (namely the silicon oxide layers) can be formed by high temperature oxidation (HTO) or chemical vapor deposition (CVD) or both HTO and CVD. The hard mask can also be made of nitride or nitrogen oxide or a combination of two or three of oxide, nitride and nitrogen oxide. After etching the trenches 55, the hard mask can be completely remained or partly remained or completely removed before filling the trenches with P type epitaxial material 53. If the hard mask is remained before the step of P type epitaxial growth, the hard mask can be removed after epitaxial growth, or be remained and used as the stop layer during the CMP process and be removed after the CMP process.

Embodiment 2

This embodiment is different from Embodiment 1 in that: in step S2, firstly grow one or more silicon oxide layers on the N type epitaxial layer 52; then form a patterned photoresist layer on the silicon oxide layers; afterwards, etch the silicon oxide layers and the N type epitaxial layer 52 by using the patterned photoresist layer as hard mask to form the trenches 55; finally, remove the photoresist layer after trench etching.

The advantageous effect of forming one or more silicon oxide layers on the N type epitaxial layer 52 is that the silicon oxide layers can prevent silicon epitaxial growth at the top of the trenches during the subsequent trench filling process, in this way, the opening of the trenches will not be easily closed, thus reducing the difficulty of the trench filling process.

Embodiment 3

This embodiment is different from Embodiment 1 in that: after step S1, form a patterned photoresist layer on the N type epitaxial layer 52 and etch the N type epitaxial layer 52 by using the patterned photoresist layer as hard mask; afterwards, remove the photoresist layer. In other words, in embodiment 3, no silicon oxide layer is formed on the N type epitaxial layer 52.

Embodiment 4

This embodiment is different from Embodiment 1 in that: the surface of the substrate is a (110) crystal plane, and correspondingly the sidewalls of the trenches have a crystal orientation of (111).

Embodiment 5

This embodiment is different from Embodiment 2 in that: the surface of the substrate is a (110) crystal plane, and correspondingly the sidewalls of the trenches have a crystal orientation of (111).

Embodiment 6

This embodiment is different from Embodiment 3 in that: the surface of the substrate is a (110) crystal plane, and correspondingly the sidewalls of the trenches have a crystal orientation of (111).

In the above embodiments, the (100), (110) and (111) crystal planes can have a deviation of ±10° in crystal orientation. The (100) crystal plane may include its congeners such as (010), (001), (00$\bar{1}$), (0$\bar{1}$0), etc. The (110) crystal plane may include its congeners such as (011), (101), etc. The (111) crystal plane may include its congeners such as (1$\bar{1}$1), (11$\bar{1}$), etc.

In the above embodiments, the epitaxial layer 52 can also be a P type epitaxial layer, and correspondingly the trenches 55 are filled with N type epitaxial material 53, wherein, the silicon source gas is at least one of SiH3Cl, SiH2Cl2, SiHCl3 and SiCl4; the halide gas is at least one of HCl and HF; the doping gas is at least one of phosphine (e.g. PH3) and arsenic hydride (e.g. AsH3). The temperature of the N type epitaxial growth is 800-1000. The pressure of the N type epitaxial growth is 0.01-760 torr.

The description and application of the present invention herein is for illustrative purposes only. They do not constitute restriction to the scope of the present invention within the aforesaid embodiments. For example, the depth of the deep trenches 55 and the thickness of the epitaxial layer 52 are only used for purpose of description of typical embodiments. The present invention shall not be limited to this. In other words, a depth of the deep trenches other than 35.0-50.0 m but within the range of 0.8-98.0 μm, and a thickness of the epitaxial layer other than 40.0-50.0 μm but within the range of 1.0-100.0 μm are also applicable to the present invention. Furthermore, the width (or critical dimension) of the trenches can be designed within a range of 0.2-10.0 μm according to the depth of the trenches.

To make deformation and change to the embodiments disclosed herein acceptable. It is generally known to those skilled in this art to adopt substituted embodiments or equivalent parts. The technicians in this art shall be clear that the present invention can be realized by means of other forms, structures, arrangements, proportions, and other assemblies, materials and parts without deviating from the spirit or essential characteristics of the present invention. The embodiments disclosed herein may be deformed and modified within the protection scope of the present invention.

What is claimed is:

1. A method of manufacturing superjunction structure, comprising:
   step 1, growing an N type epitaxial layer on a substrate having a (100) or (110) oriented surface;
   step 2, etching the N type epitaxial layer to form trenches therein;
   step 3, tilling the trenches by P type epitaxial growth in the trenches by using a mixture of silicon source gas, halide gas, hydrogen gas, and doping gas.

2. The method according to claim 1, wherein the N type epitaxial layer as formed in step 1 has a thickness of 1.0 μm to 100.0 μm.

3. The method according to claim 1, wherein the trenches as formed in step 2 each has a width of 0.2 μm to 10.0 μm, and a depth of 0.8 μm to 98.0 μm.

4. The method according to claim 1, wherein the top profile of the trench is in a shape of square, rectangle or stripe.

5. The method according to claim 4, wherein when the top profile of the trench is square or rectangular:
   if the substrate has a (100) oriented surface, the sidewalls of the trench have a crystal orientation of (100);
   if the substrate has a (110) oriented surface, the sidewalls of the trench have a crystal orientation of (111);
   the bottom profile of the trench is a curved surface with complicated crystal orientations.

6. The method according to claim, 4, wherein when the profile of the trench is in a shape of stripe:
   if the substrate has a (100) oriented surface, the longer sidewalls of the trench have a crystal orientation of (100)

while the shorter sidewalls of the trench can be a (100) crystal plane or a plane having multiple crystal orientations or a curved surface;

if the substrate has a (110) oriented surface, the longer sidewalls of the trench have a crystal orientation of (111) while the shorter sidewalls of the trench can be a (111) crystal plane or a plane having multiple crystal orientations or a curved surface;

the bottom profile of the trench is a curved surface with complicated crystal orientations.

7. The method according to claim 1, wherein the P type epitaxial growth in step 3 is performed under a temperature of 800-1000° C., and a pressure of 0.01 torr to 760 torr.

8. The method according to claim 1, wherein the silicon source gas is at least one of SiH3Cl, SiH2Cl2, SiHCl3 and SiCl4.

9. The method according to claim 1, wherein the halide gas is HCl or HF.

10. The method according to claim 1, wherein the doping gas is boron hydride.

11. The method according to claim 1, wherein the trenches are tilled by one or more steps of P type epitaxial growth, and before the trenches are completely filled, the opening of the trenches can be enlarged by supplying the halide gas only, or a mixture of the halide gas and the hydrogen gas, or a mixture of the halide gas, the hydrogen gas, and the doping gas.

12. A method of manufacturing superjunction structure, comprising:
    step 1, growing a P type epitaxial layer on a substrate having a (100) or (110) oriented surface;
    step 2, etching the P type epitaxial layer to form trenches therein;
    step 3, filling the trenches by N type epitaxial growth in the trenches by using a mixture of silicon source gas, halide gas, hydrogen gas, and doping gas.

13. The method according to claim 12, wherein the P type epitaxial layer as formed in step 1 has a thickness of 1.0 µm to 100.0 µm.

14. The method according to claim 12, wherein the trenches as formed in step 2 each has a width of 0.2 µm to 10.0 µm, and a depth of 0.8 µm to 98.0 µm.

15. The method according to claim 12, wherein the top profile of the trench is in a shape of square, rectangle or stripe.

16. The method according to claim 15, wherein when the top profile of the trench is square or rectangular:
    if the substrate has a (100) oriented surface, the sidewalls of the trench have a crystal orientation of (100);
    if the substrate has a (110) oriented surface, the sidewalls of the trench have a crystal orientation of (111);
    the bottom profile of the trench is a curved surface with complicated crystal orientations.

17. The method according to claim 15, wherein when the profile of the trench is in a shape of stripe:
    if the substrate has a (100) oriented surface, the longer sidewalls of the trench have a crystal orientation of (100) while the shorter sidewalls of the trench can be a (100) crystal plane or a plane having multiple crystal orientations or a curved surface;
    if the substrate has a (110) oriented surface, the longer sidewalls of the trench have a crystal orientation of (111) while the shorter sidewalls of the trench can be a (111) crystal plane or a plane having multiple crystal orientations or a curved surface;
    the bottom profile of the trench is a curved surface with complicated crystal orientations.

18. The method according to claim 12, wherein the N type epitaxial growth in step 3 is performed under a temperature of 800-1000° C., and a pressure of 0.01 torr to 760 torr.

19. The method according to claim 12, wherein the silicon source gas is at least one of SiH3Cl, SiH2Cl2, SiHCl3 and SiCl4.

20. The method according to claim wherein the halide gas is HCl or HF.

21. The method according to claim 12, wherein the doping gas is at least one of phosphine and arsenic hydride.

22. The method according to claim 12, wherein the trenches are tilled by one or more steps of N type epitaxial growth, and before the trenches are completely filled, the opening of the trenches can be enlarged by supplying the halide gas only, or a mixture of the halide gas and the hydrogen gas, or a mixture of the halide gas, the hydrogen gas, and the doping gas.

* * * * *

UNITED STATES PATENT AND TRADEMARK OFFICE
CERTIFICATE OF CORRECTION

PATENT NO. : 8,440,529 B2
APPLICATION NO. : 13/075017
DATED : May 14, 2013
INVENTOR(S) : Jiquan Liu and Xuan Xie Page 1 of 1

It is certified that error appears in the above-identified patent and that said Letters Patent is hereby corrected as shown below:

In the Claims

Column 6, Claim 1, line 45, please delete "tilling" and insert --filling--.

Column 7, Claim 11, line 22, please delete "tilled" and insert --filled--.

Column 8, Claim 22, line 36, please delete "tilled" and insert --filled--.

Signed and Sealed this
Twelfth Day of November, 2013

Teresa Stanek Rea
*Deputy Director of the United States Patent and Trademark Office*